(12) United States Patent
Kanskar et al.

(10) Patent No.: US 12,374,849 B2
(45) Date of Patent: *Jul. 29, 2025

(54) TANDEM PUMPED FIBER AMPLIFIER

(71) Applicant: NLIGHT, INC., Camas, WA (US)

(72) Inventors: Manoj Kanskar, Portland, OR (US); Jiamin Zhang, Vancouver, WA (US)

(73) Assignee: nLIGHT, Inc., Camas, WA (US)

( * ) Notice: Subject to any disclaimer, the term of this patent is extended or adjusted under 35 U.S.C. 154(b) by 742 days.

This patent is subject to a terminal disclaimer.

(21) Appl. No.: 17/687,575

(22) Filed: Mar. 4, 2022

(65) Prior Publication Data

US 2022/0190545 A1 Jun. 16, 2022

Related U.S. Application Data

(63) Continuation-in-part of application No. 17/555,144, filed on Dec. 17, 2021, now abandoned, which is a
(Continued)

(51) Int. Cl.
*H01S 3/067* (2006.01)
*G02B 6/02* (2006.01)
(Continued)

(52) U.S. Cl.
CPC ...... *H01S 3/06758* (2013.01); *G02B 6/02042* (2013.01); *G02B 6/24* (2013.01);
(Continued)

(58) Field of Classification Search
CPC ........... H01S 5/094096; H01S 5/06758; H01S 5/094053; H01S 5/094042; H01S 5/094007
See application file for complete search history.

(56) References Cited

U.S. PATENT DOCUMENTS 9,134,538 B1  9/2015 Augst et al.
9,136,667 B2  9/2015 Chann et al.
(Continued)

FOREIGN PATENT DOCUMENTS

AU   2009200094    2/2009
CN     102292883   12/2011
(Continued)

OTHER PUBLICATIONS

Wu et al, "Thermal induced polarization coupling in double-cladding linearly polarized fiber lasers" Optics Communications, Elsevier, Amsterdam NL, vol. 512, Feb. 11, 2022 XP086986452, ISSN: 0030-4018, DOI: 10.1016/J.OPTCOM.2022.128036 [Retrieved on Feb. 11, 2022] the whole document.

(Continued)

*Primary Examiner* — Michael Carter
(74) *Attorney, Agent, or Firm* — Wiley Rein LLP

(57) ABSTRACT

In an example, a tandem pumped fiber amplifier may include a seed laser, a first section coupled to an output of the seed laser, and a second section coupled to an output of the first section. The first section may operate as an oscillator, and may receive pump light from one or more diode pumps, and may the first section may be arranged to convert the one or more diode pumps into a tandem pump. The second section may operate as a power amplifier, and may include a length of a single or plural active core fiber. The tandem pumped fiber amplifier may be arranged to mitigate spectral broadening related to four-wave mixing.

19 Claims, 12 Drawing Sheets

Related U.S. Application Data continuation of application No. 16/200,462, filed on Nov. 26, 2018, now Pat. No. 11,211,765, which is a continuation-in-part of application No. 15/782,756, filed on Oct. 12, 2017, now Pat. No. 10,211,591.

(60) Provisional application No. 62/408,046, filed on Oct. 13, 2016.

(51) Int. Cl.
| | | |
|---|---|---|
| *G02B 6/24* | (2006.01) | |
| *H01S 3/094* | (2006.01) | |
| *H01S 3/10* | (2006.01) | |
| *H01S 3/23* | (2006.01) | |
| *H01S 5/065* | (2006.01) | |

(52) U.S. Cl.
CPC ........ *H01S 3/0672* (2013.01); *H01S 3/06729* (2013.01); *H01S 3/06737* (2013.01); *H01S 3/0675* (2013.01); *H01S 3/094007* (2013.01); *H01S 3/094042* (2013.01); *H01S 3/10092* (2013.01); *H01S 3/2308* (2013.01); *H01S 5/0656* (2013.01)

(56) References Cited

U.S. PATENT DOCUMENTS

| | | | |
|---|---|---|---|
| 10,211,591 | B2 | 2/2019 | Kanskar |
| 10,374,379 | B2 | 8/2019 | Augst |
| 10,951,001 | B2 | 3/2021 | Kanskar |
| 11,211,765 | B2* | 12/2021 | Kanskar ............. H01S 3/06737 |
| 2002/0008901 | A1 | 1/2002 | Kinoshita |
| 2005/0024716 | A1 | 2/2005 | Nilsson |
| 2005/0207455 | A1 | 9/2005 | MacCormack |
| 2006/0187973 | A1 | 8/2006 | Varnham |
| 2007/0115541 | A1 | 5/2007 | Rogers |
| 2008/0030847 | A1 | 2/2008 | Murison |
| 2008/0130102 | A1* | 6/2008 | Murison ............. H04B 10/291 359/341.5 |
| 2010/0202481 | A1 | 8/2010 | Morasse |
| 2011/0249321 | A1 | 10/2011 | Savage-Leuchs |
| 2011/0280581 | A1 | 11/2011 | Chann et al. |
| 2012/0057220 | A1 | 3/2012 | Langseth |
| 2012/0188626 | A1 | 7/2012 | Rothenberg |
| 2013/0322470 | A1 | 12/2013 | Creeden |
| 2014/0050234 | A1 | 2/2014 | Ter-Mikirtychev |
| 2014/0083197 | A1 | 3/2014 | Zadok |
| 2015/0138630 | A1* | 5/2015 | Honea ................. H01S 3/042 359/341.3 |
| 2016/0226210 | A1 | 8/2016 | Zayhowski |
| 2018/0109064 | A1 | 4/2018 | Kanskar |
| 2018/0145476 | A1 | 5/2018 | Price |
| 2018/0198251 | A1 | 7/2018 | Kanskar |
| 2019/0097377 | A1 | 3/2019 | Kanskar |
| 2021/0006029 | A1 | 1/2021 | Augst et al. |
| 2023/0341263 | A1* | 10/2023 | Endo .................... G02B 6/00 |

FOREIGN PATENT DOCUMENTS

| | | |
|---|---|---|
| CN | 103560382 | 2/2014 |
| CN | 105305211 | 2/2016 |
| EP | 3526862 | 8/2020 |
| WO | WO2005057737 | 6/2005 |
| WO | WO2010083595 | 7/2010 |
| WO | WO2018071712 | 4/2018 |
| WO | WO2018186920 | 10/2018 |
| WO | WO2020112447 | 6/2020 |

OTHER PUBLICATIONS

Xio et al., "Experimental study on tandem pumped fiber amplifier", Optics and Laser Technology, vol. 44, No. 5, Feb. 11, 2022, pp. 1570-1573, XP028891154, ISSN: 0030-3992, DOI: 10.1016/J. OPTLASTEC.2011.11.047 the whole document.

Guan et al.: "High-efficiency and high-power single-frequency fiber laser at 1.6um based on cascaded energy-transfer pumping", arxiv. org, Cornell University Library, 201 Olin Library Cornell University Ithaca, NY 14853, Nov. 2, 2019, XP081524587, the whole document.

European Patent Office; International Search Report and Written Opinion PCT/US2023/012729 dated Jun. 12, 2023; 17 Pages.

Beier, F. et al.; "6.8 kW Peak Power Quasi-Continuous Wave Tandem-pumped Ytterbium Amplifier at 1071nm nm"; Fiber Lasers XII: Technology Systems and Applications; Proc. of SPIE vol. 9344, 93441H (Mar. 4, 2015); 3 pages.

Zhou, Pu et al.; "High-Power Fiber Lasers Based on Tandem Pumping"; Journal Optical Society of America, vol. 34, No. 3; Mar. 2017; 8 pages.

Naderi, Shadi et al.: "Theoretical Analysis of Effect of Pump and Signal Wavelengths on Modal Instabilities in Yb-doped Fiber Amplifiers"; Proc. of SPIE vol. 8964 8964W-1; (Feb. 20, 2014); 7 pages.

Hu Xiao et al; "High Power 1018 Nmytterbium-Doped fiber Laser and its Application in Tandem Pump"; Applied Optics, vo. 54, No. 27; Sep. 16, 2015; pp. 8166.

Christopher A. Codemard et al.; "Tandem Pumping of Large-Core Double-Clad Ytterbium-Doped Fiber for Control of Excess Gain"; Lasers, Sources and Related Photonic Devices; University of Southampton, UK; copyright 2010 Optical Society of America; 3 pages.

Hao Jin-Ping et al.; "Optical Properties of Ytterbium-Doped Tandem-Pumped Fiber Oscillator"; Chinese Physics, Bristol GB; vol. 23, No. 1; Jan. 28, 2014; p. 14203.

Xiao Hu et al.; "Experimental Study on Tandem Pumped Fiber Amplifier"; Optics and Laser Technology, vol. 44, No. 5; copyright 2012 Elsevier Ltd.; 4 pages.

European Patent Office (EPO, Rijswijk, NL); International Search Report and Written Opinion PCT/US2017/056402 dated Feb. 23, 2018; 18 Pages.

European Patent Office; International Search Report and Written Opinion PCT/US2019/062285 dated Mar. 18, 2020; 16 Pages.

European Patent Office; International Search Report and Written Opinion PCT/US2018/013402 dated Nov. 9, 2018; 15 Pages.

Chang You Min et al.; "3% Thermal IJad Measured in Tandem-pumped Yterrbium-doped Fiber Amplifier"; 2014 Conference on Lasers and Electro-Optics (CLEO)—Laser Science Photonic Applications, The Optical Society, Jun. 8, 2014; 2 pages.

Tianfu Yao et al.; "Tandem-pumped ytterbium-doped aluminosilicate fiber amplifer with low quantum defect"; Lasers and Electro-Optics (CLEO), 2012 Conference, ON, IEEE; May 6, 2012; 2 pages.

Wang Xuejiao et al.; "First experimental investigation of the amplification of a Yb-doped fiber laser pumped with 1000 and 1014-nm laser diodes", Optical Review, Springer Verlag, Tokyo, JP, vol. 22, No. 5; Jul. 21, 2015, pp. 693-699.

Engin, "1kW cw fiber-amplifier with < 0.5 GHz linewidth and near-diffraction limited beam-quality for coherent combining application", Feb. 21, 2011, Proceedings of SPIE 7914, 791407-1, 791407-7 (2011).

European Patent Office; International Preliminary Report on Patentability PCT/US2019/062285 dated Jun. 10, 2021; 10 Pages.

Flores, "Pseudo-random binary sequence phase modulation for narrow linewidth, kilowatt, monolithic fiber amplifiers," Jul. 28, 2014, Optics Express, vol. 22, No. 15, pp. 17735-17744 (2014).

* cited by examiner

TANDEM PUMPED FIBER AMPLIFIER

CROSS REFERENCE TO RELATED APPLICATION

This application is a continuation-in-part of U.S. patent application Ser. No. 17/555,144, filed on Dec. 17, 2021, which is a continuation of U.S. patent application Ser. No. 16/200,462, filed on Nov. 26, 2018, which is a continuation-in-part of U.S. patent application Ser. No. 15/782,756, filed Oct. 12, 2017, which claims the benefit of U.S. Provisional Application No. 62/408,046, filed Oct. 13, 2016, each of which is incorporated herein by reference in its entirety.

TECHNICAL FIELD

The present disclosure relates to fiber amplifiers.

BACKGROUND

High average power fiber lasers with diffraction-limited beams that are suitable for High Energy Laser (HEL) applications are currently primarily limited in output power by Stimulated Brillouin Scattering (SBS) and Modal Instability. Some known systems have been effective to scale power to greater than the 2 kW level by mitigating SBS. However, Modal Instability may still bottleneck power-scaling in regular large-mode area (LMA) fiber, e.g., non-photonic-crystal fiber (PCF) and/or photonic bandgap (PBG) fiber. Specifically, Modal Instability may limit diffraction limited output power to a threshold near 2 kW, such as ~2.2 kW for 20 μm core step-index dual-clad fiber laser.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

Figure 3A:
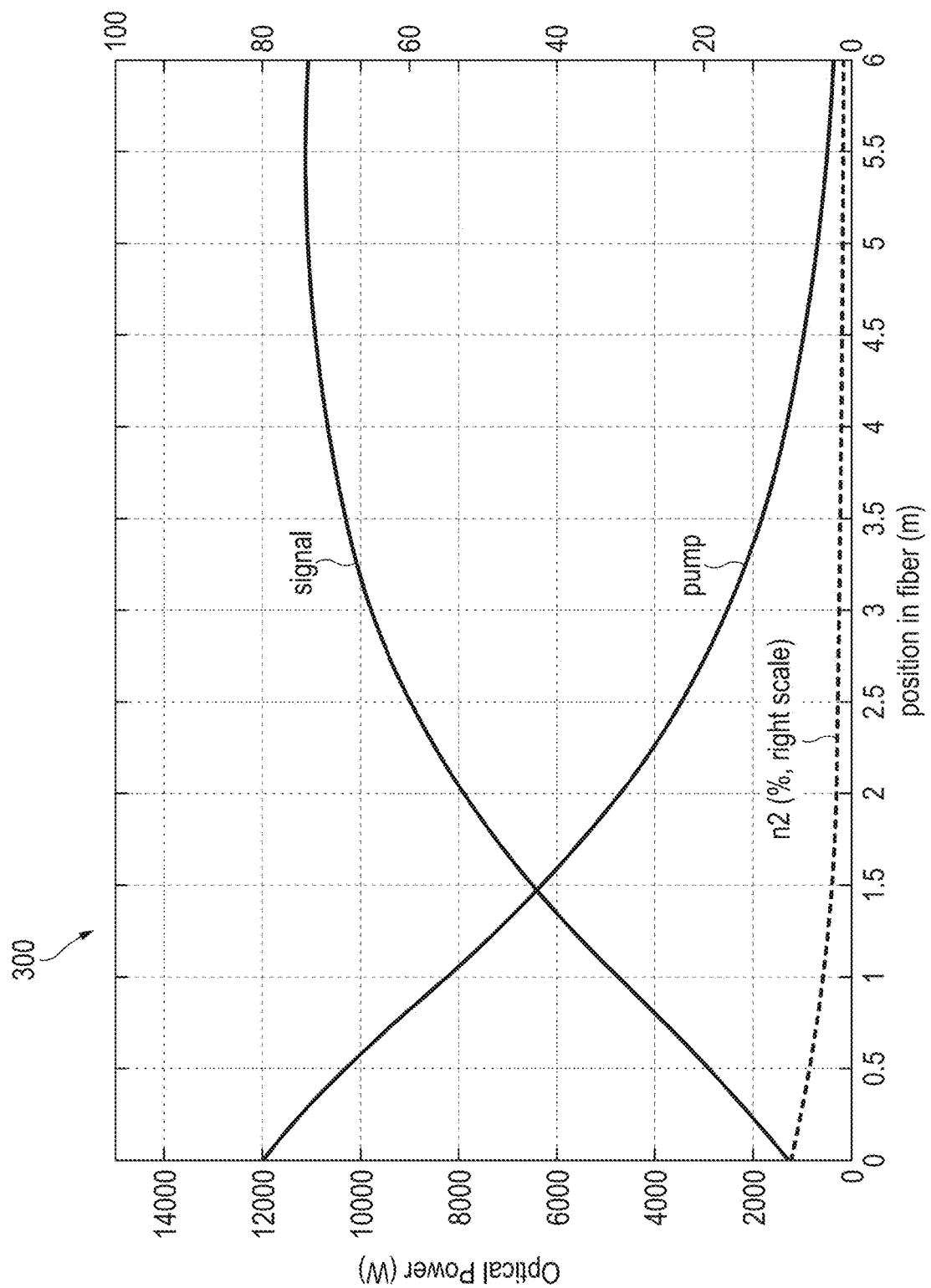
Figure 3B:
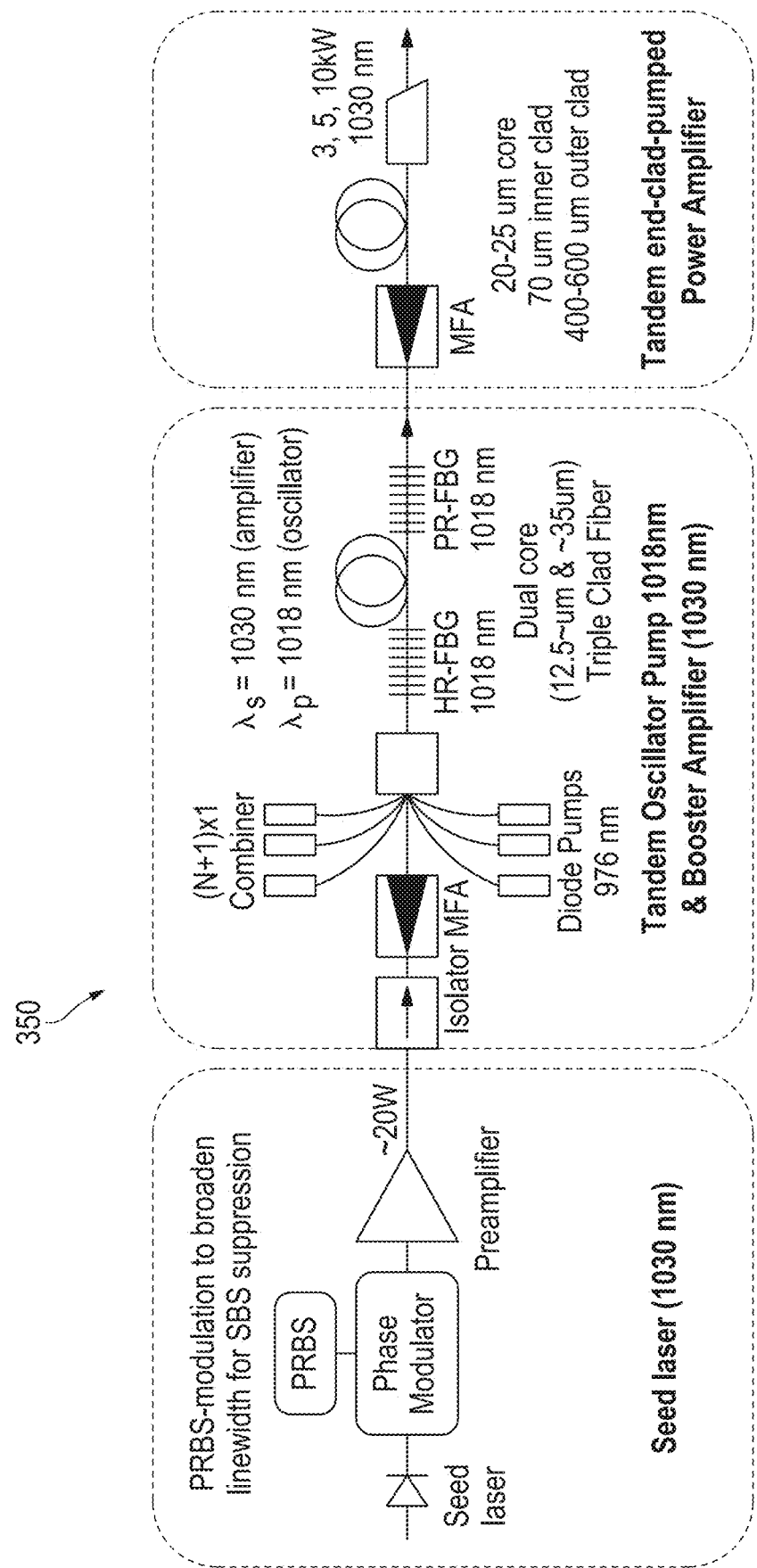
Figure 3C:
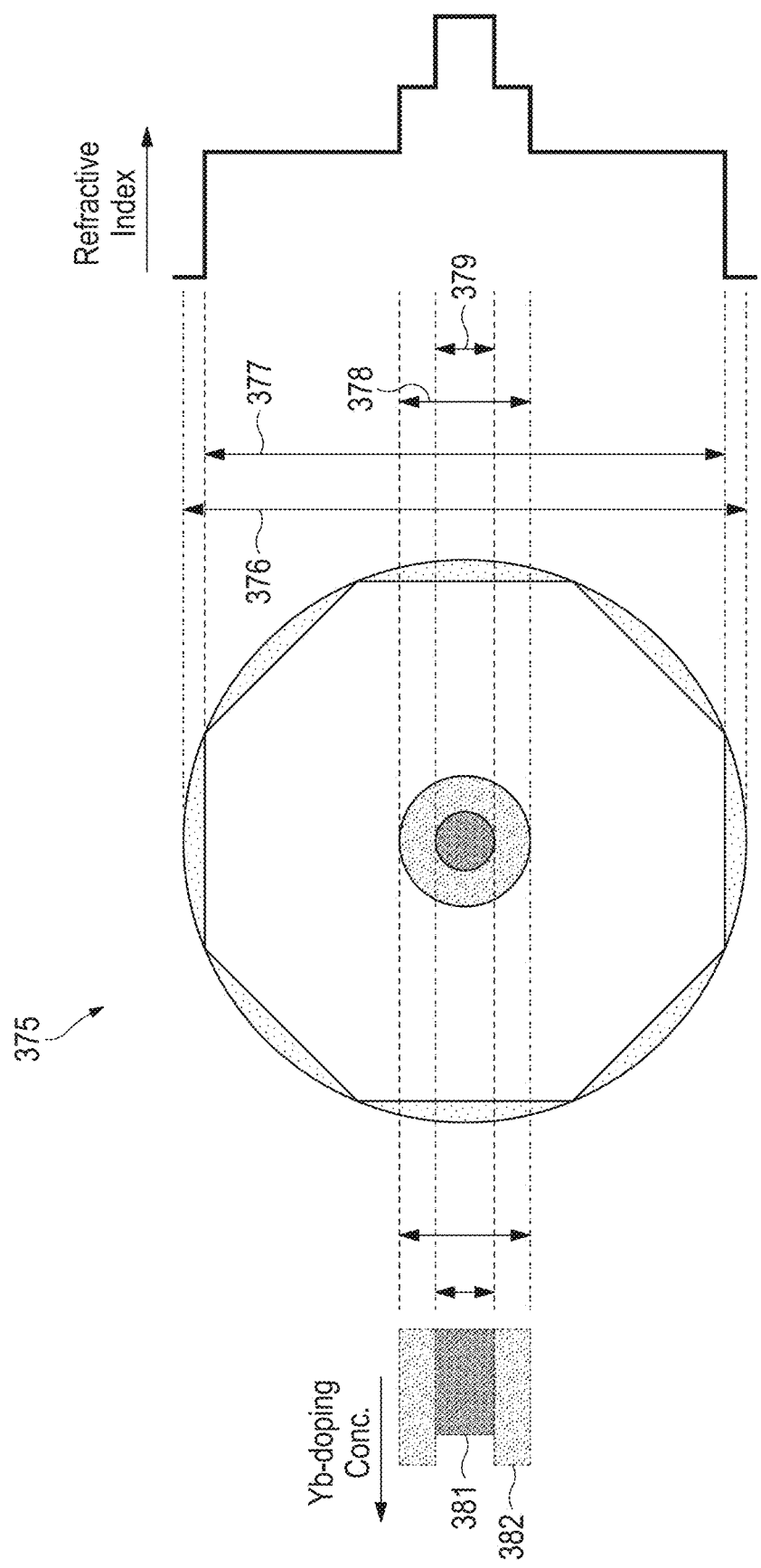

FIGS. 3A-C illustrate, respectively, a graph of calculated signal power and tandem pump power inside a final power amplifier along with upper state population for a tandem pumped fiber amplifier, a block diagram of the tandem pumped fiber amplifier, and a cross-section view of a dual-core and all-glass-fiber of the tandem pumped fiber amplifier.

Figure 4:
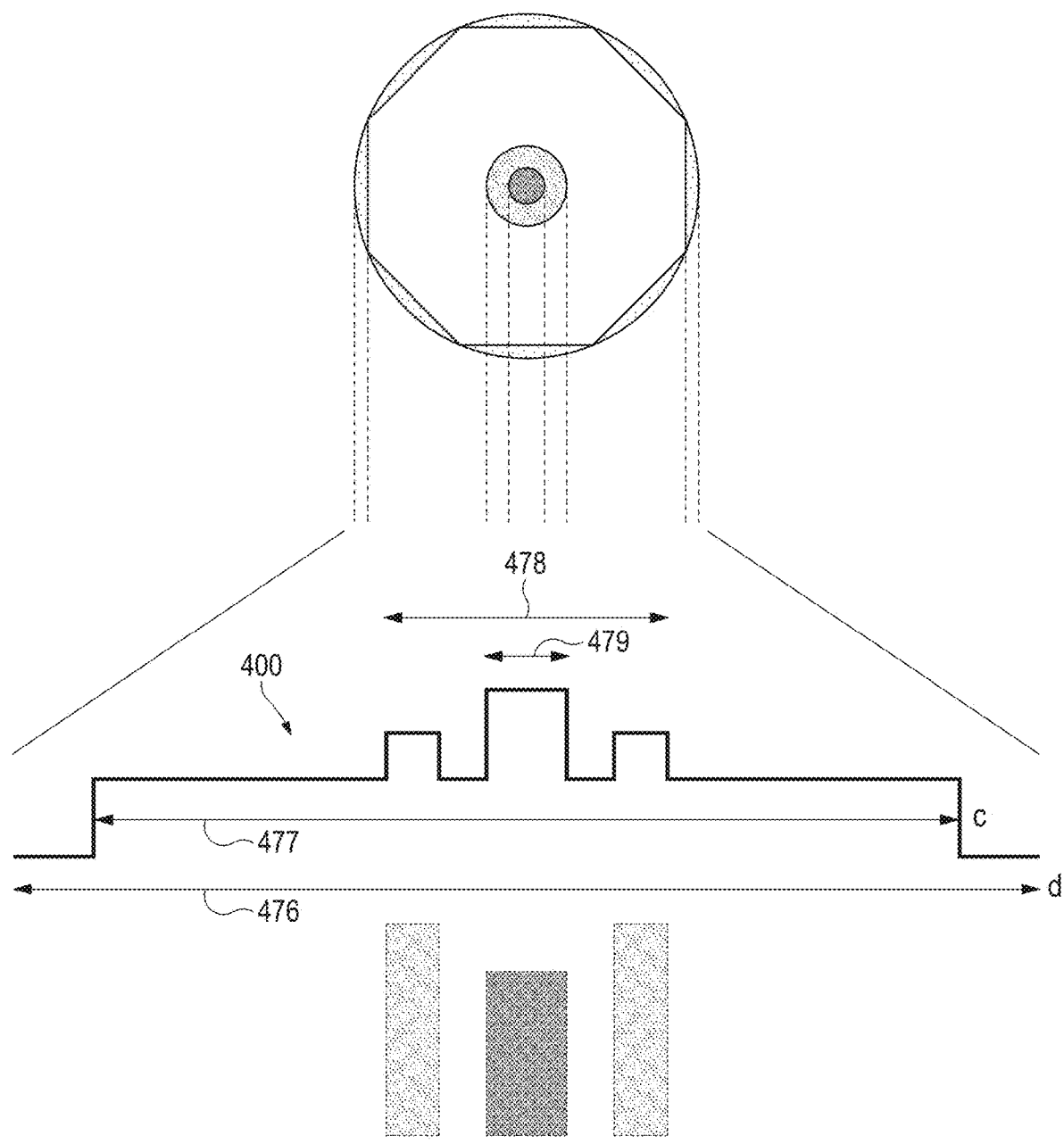

FIG. 4 illustrates a refractive index of a fiber similar to the fiber of FIG. 3C.

Figure 1:
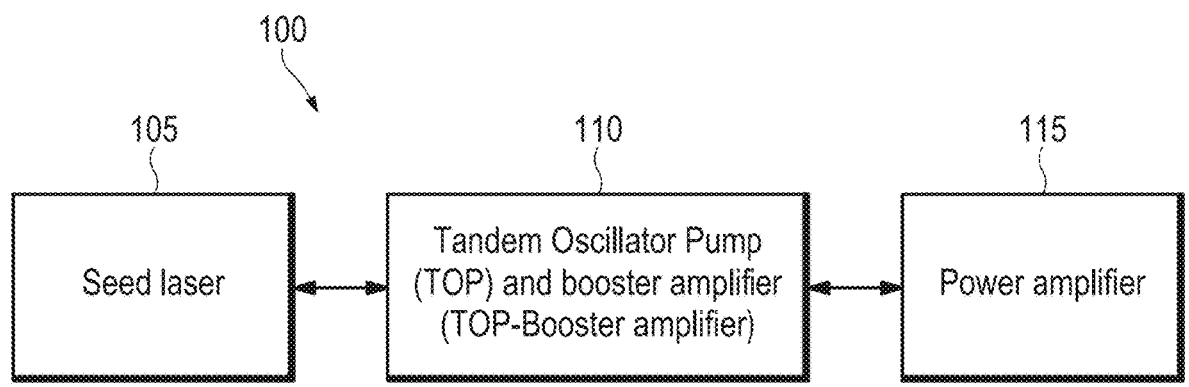
FIG. 1 illustrates a tandem pumped fiber amplifier.
Figure 5:
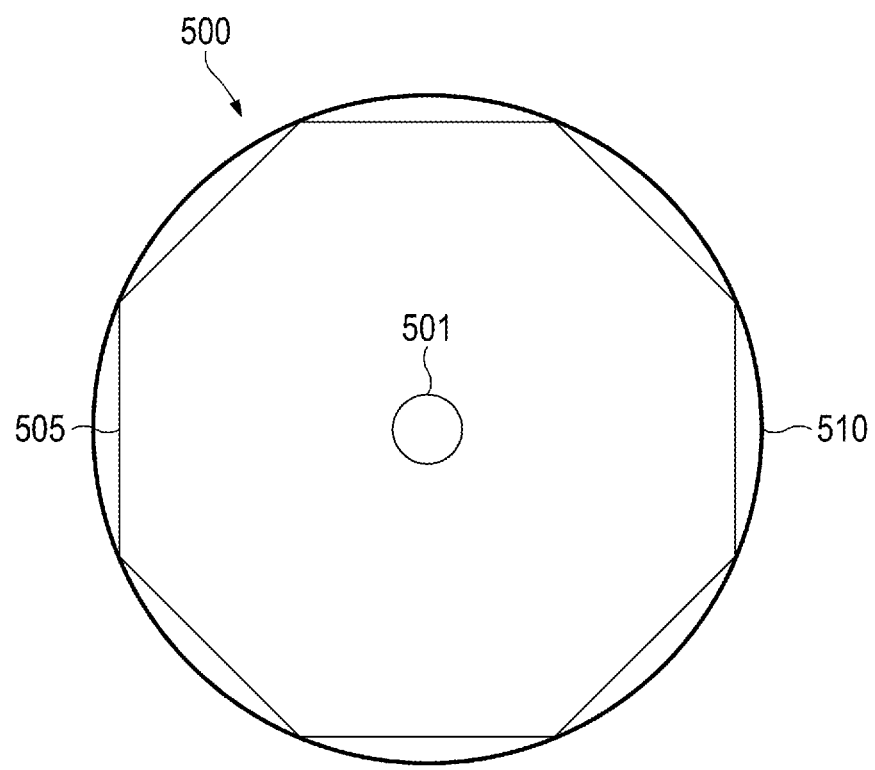

FIG. 5 illustrates a cross-section view of a single active core fiber that may be utilized in the tandem pumped fiber amplifier of FIG. 1, in some embodiments.

Figure 6A:
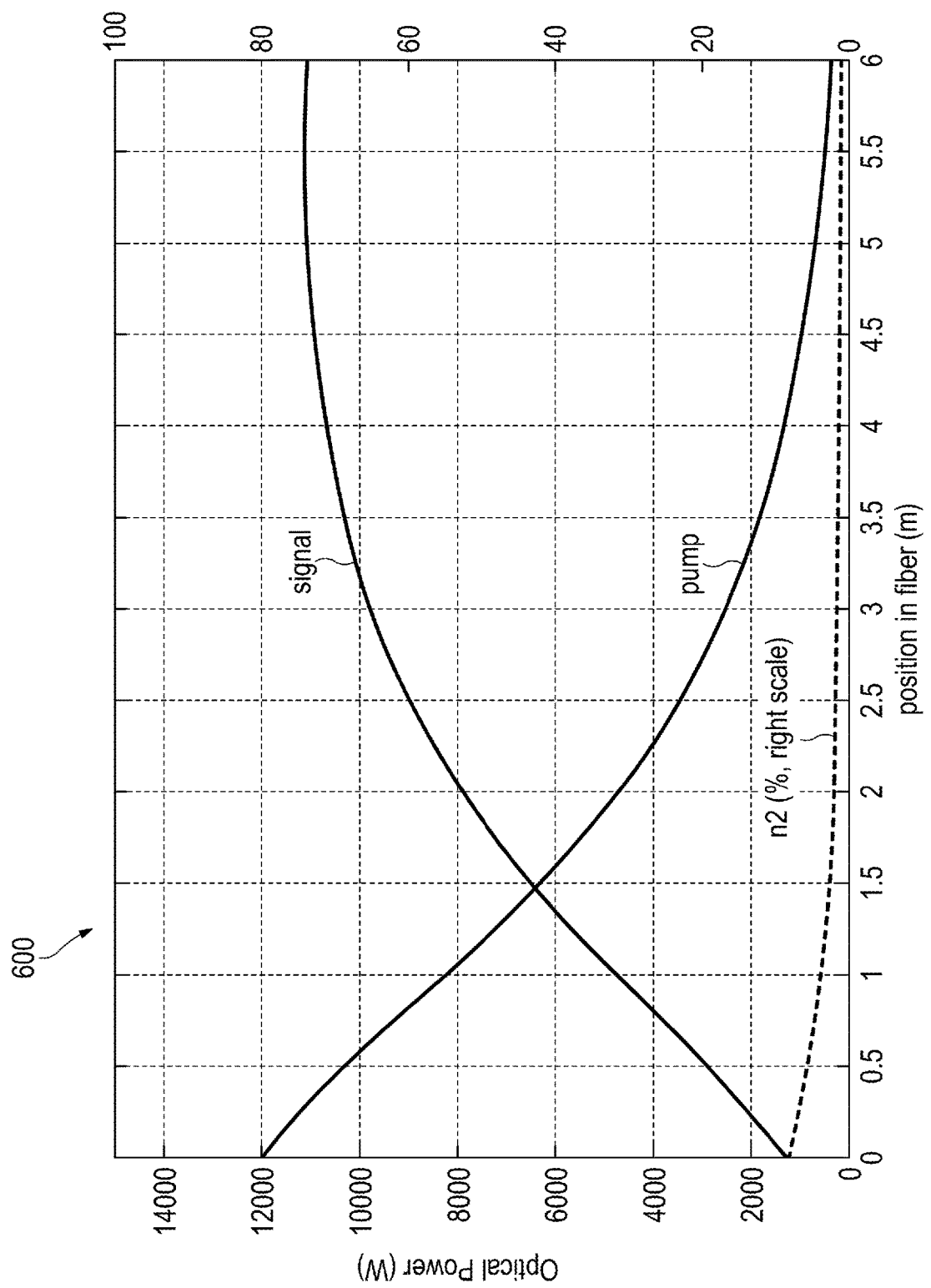
Figure 6B:
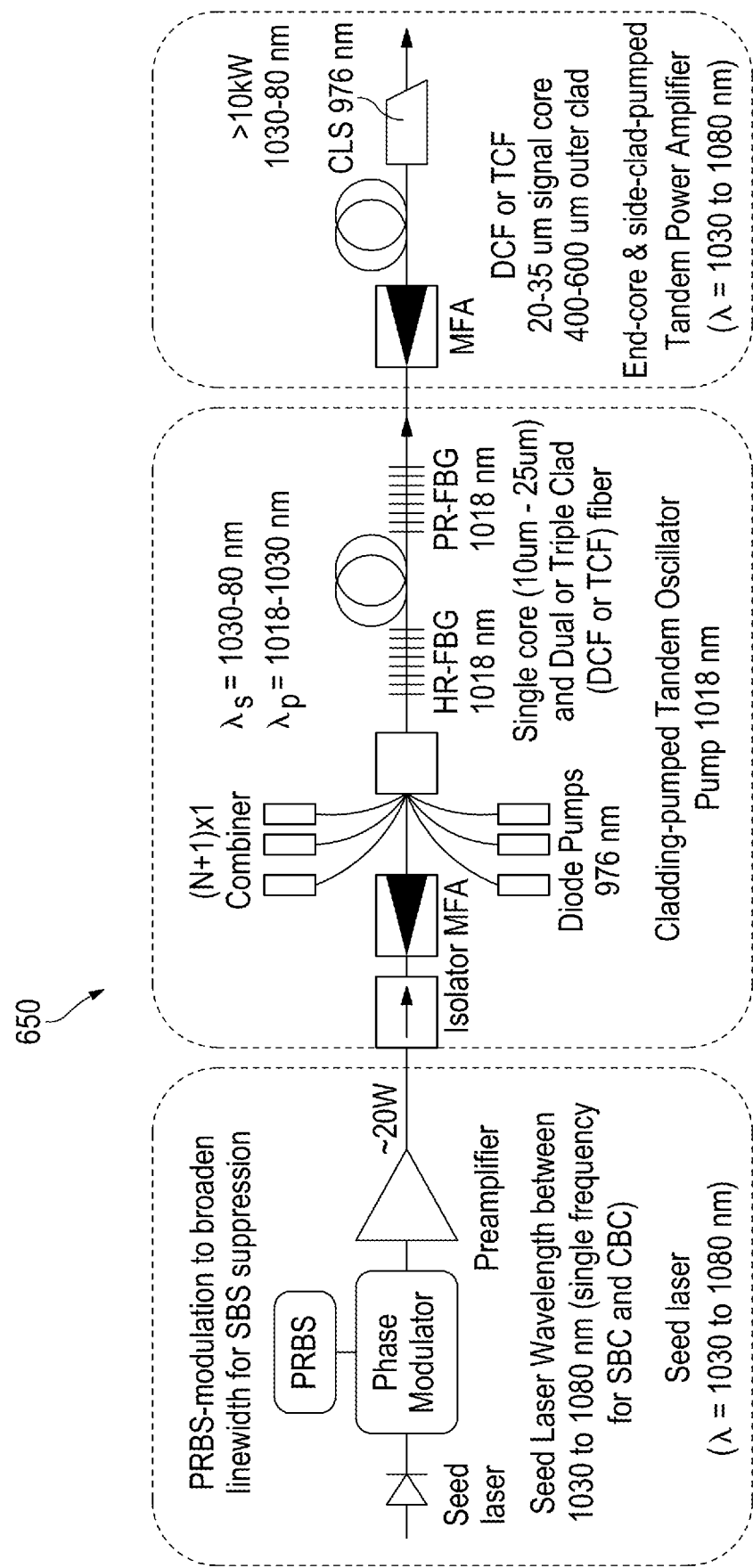
Figure 6C:
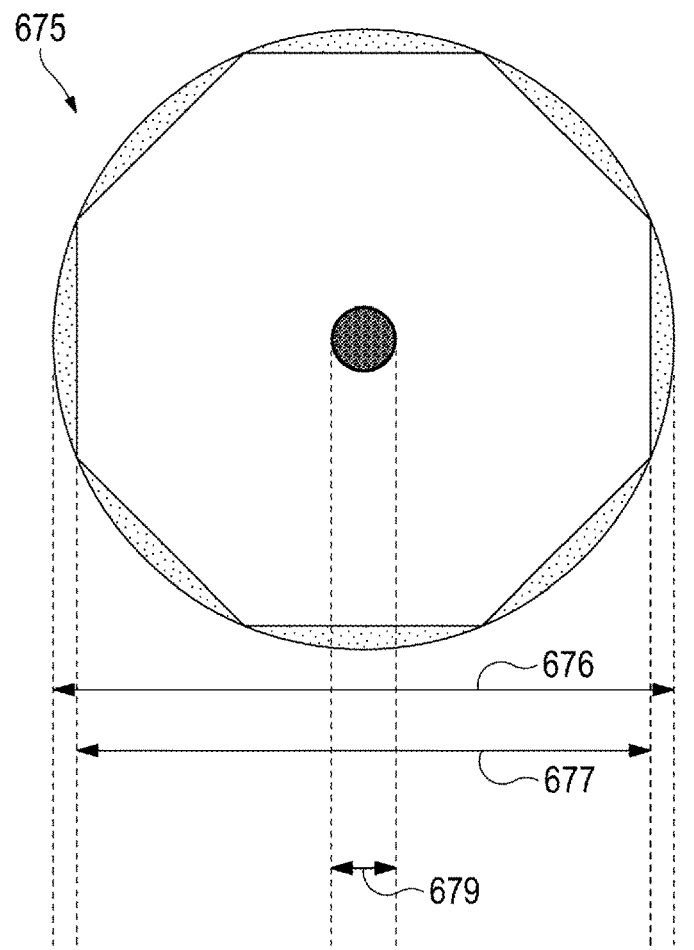
Figure 6C:
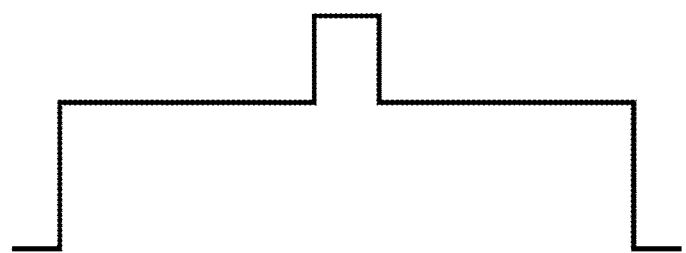
Figure 6C:
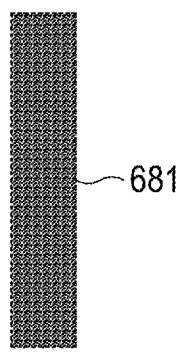

FIGS. 6A-C illustrate, respectively, a graph of calculated signal power and tandem pump power inside a final power amplifier along with upper state population for a tandem pumped fiber amplifier, a block diagram of the tandem pumped fiber amplifier, and a cross-section view of a single active core and all-glass-fiber of the tandem pumped fiber amplifier.

Figure 7:
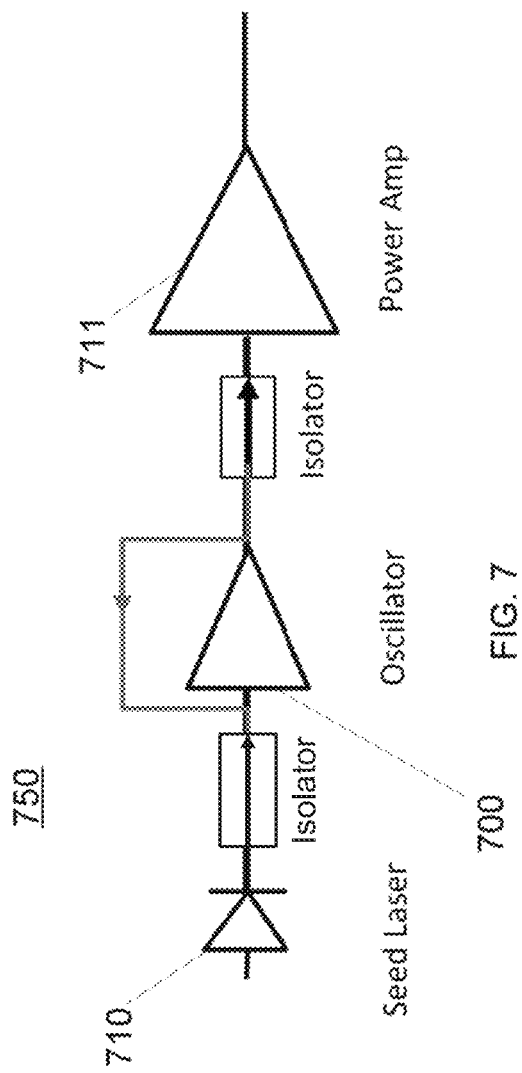

FIG. 7 illustrates a block diagram of a tandem pumped fiber amplifier with polarization control, according to various embodiments.

Figure 8:
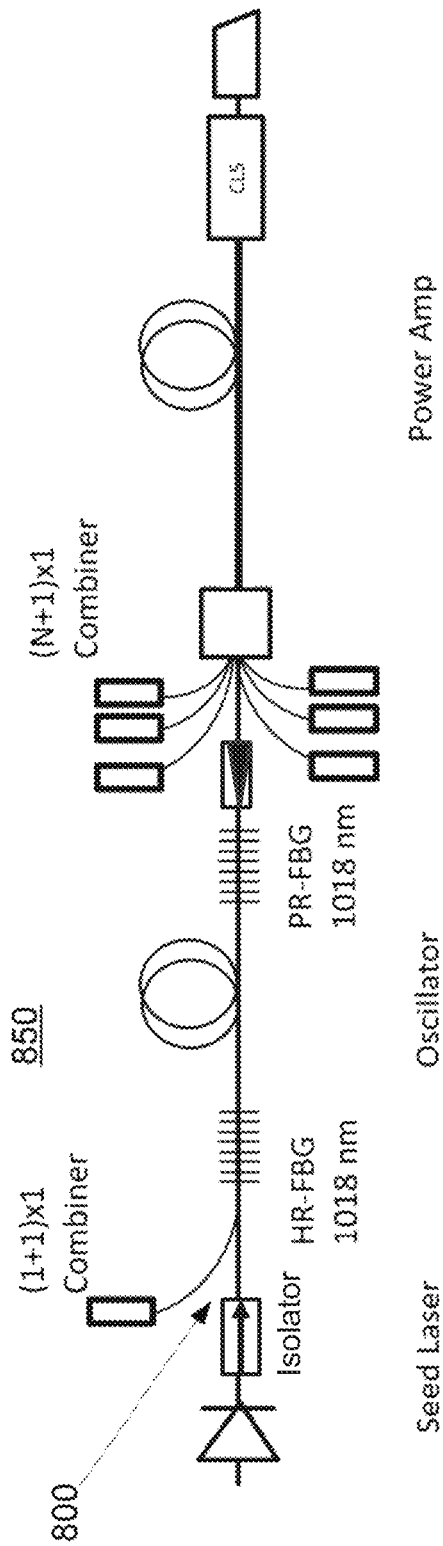

FIG. 8 illustrates a block diagram of a tandem pumped fiber amplifier using a low power pump, according to various embodiments.

Figure 9:
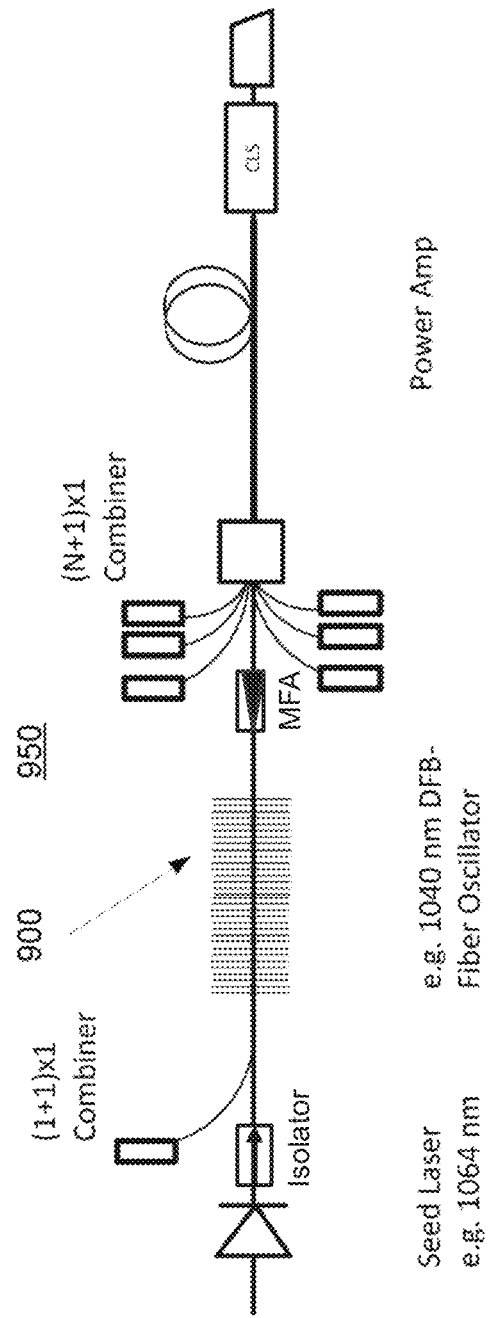

FIG. 9 illustrates a block diagram of a tandem pumped fiber amplifier using a fiber DFB (distributed feedback) oscillator, according to various embodiments.

Figure 10:
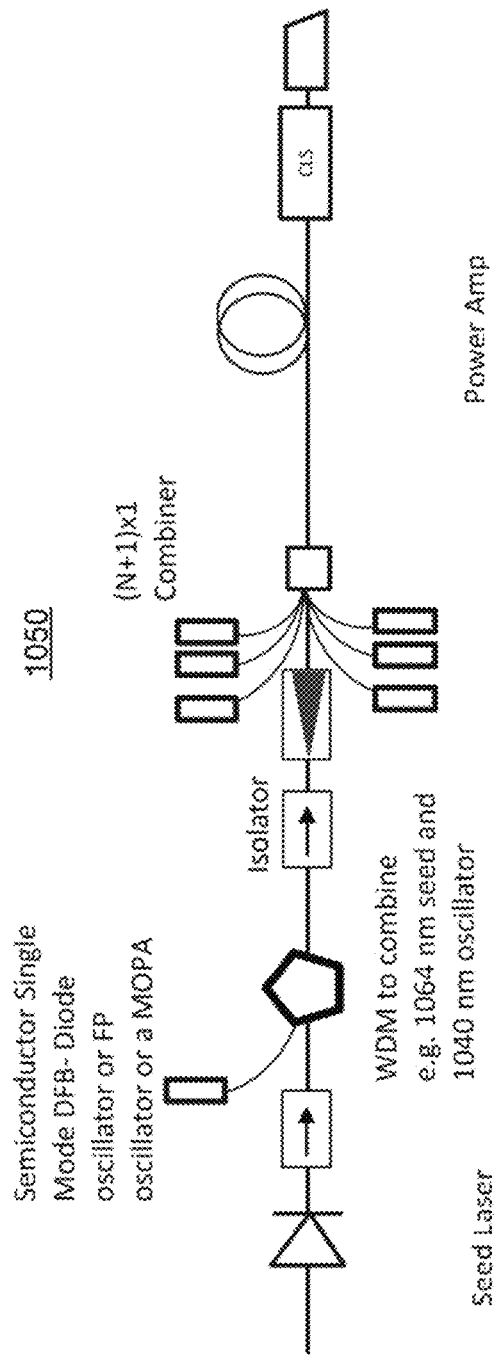

FIG. 10 illustrates a block diagram of a tandem pumped fiber amplifier using a semiconductor single mode DFB diode oscillator, a semiconductor field programmable oscillator, or a semiconductor MOPA (master oscillator power amplifier), according to various embodiments.

Figure 11:
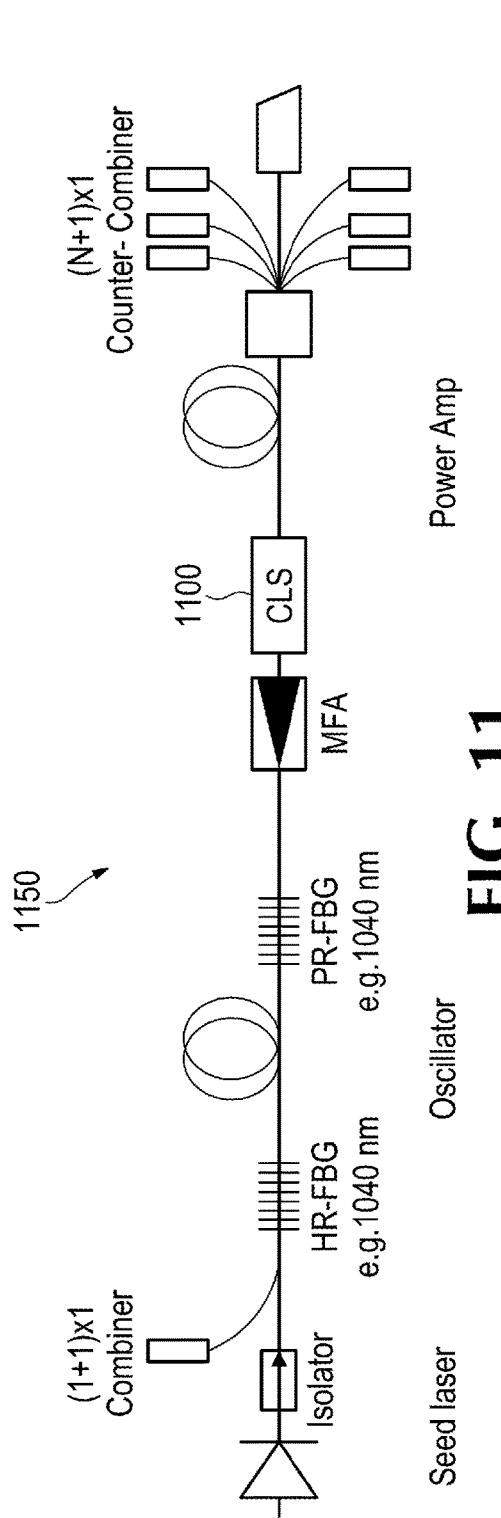

FIG. 11 illustrates a block diagram of a counter-pumped fiber amplifier, according to various embodiments.

Figure 12:
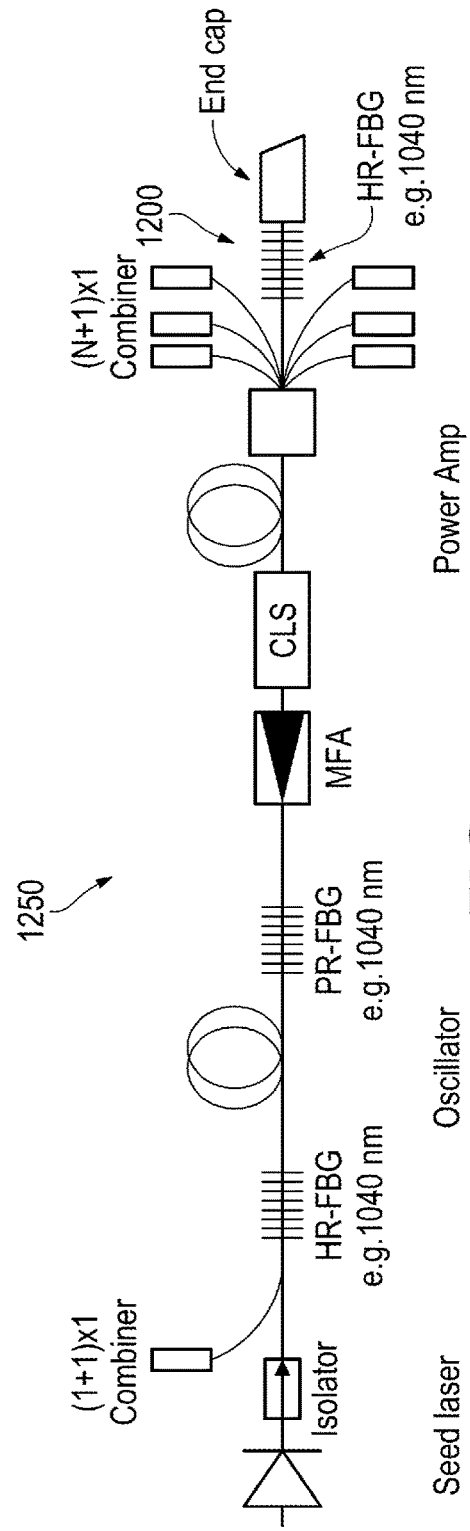

FIG. 12 illustrates a block diagram of another counter-pumped fiber amplifier, according to various embodiments.

DETAILED DESCRIPTION

Some embodiments of a tandem pumped fiber amplifier may include a seed laser, one or more diode pumps, and a single or plural active core fiber. The single or plural active core fiber may include a first section to operate as an oscillator and a second different section to operate as a power amplifier. The one or more diode pumps may be optically coupled to the first section of the single or plural active core fiber, and the seed laser may be optically coupled to the single active core or an innermost core of the plural active core fiber.

Some embodiments use a single active core oscillator and single active core tandem amplifier (core pumped). Core tandem-pumping may provide relatively high absorption and/or efficiency. As a result, fiber length may be relatively short, which may provide a relatively large margin for deleterious nonlinear effects such as SBS, SRS (stimulated Raman Scattering), FWM (four-wave mixing), SPM (self-phase modulation), or the like, or combinations thereof. One embodiment provides a greater than 4 kW single narrow-band fiber amplifier.

Any tandem pumped fiber amplifier described herein may be less bulky (e.g., smaller and/or not as heavy) and/or less costly than a system using a 10 kW single mode fiber laser in a regular LMA fiber using numerous 1018 nm single mode tandem fiber lasers as high brightness pump sources. The tandem pumped fiber amplifiers may have lower power requirements and/or lower thermal dissipation requirements than such systems as well.

Whereas a system using a 10 kW single mode fiber laser in a regular LMA fiber using numerous 1018 nm single mode tandem fiber lasers as high brightness pump sources may require a reduction in quantum-defect heating from the usual ~9% in the 976 nm pumped system down to ~4% in the tandem 1018 nm pumped amplifiers to achieve 10 kW, embodiments disclosed herein may not be subject to the same requirement in order to achieve 10 kW or greater. A system employing a tandem pumped fiber amplifier may be compatible with regular LMA fiber technology but scalable from a few kilowatts to 10 kW or more by scaling up the multimode diode laser pump power. As a result, embodiments described herein may simplify manufacturing in high energy laser applications. In a system employing a tandem pumped fiber amplifier, a final amplifier stage may be greater than 1 kW to address Modal Instability. A tandem pumped fiber amplifier may push the single channel output power to greater than known thresholds created by Modality Instability, such as 3 kW, 5 kW, 10 kW, or more.

Several advantages of this approach have been identified. First, the quantum defect in the power amplifier may be only 1.5% at 1030 nm when pumped at 1018 nm, in some embodiments. At a nominal wavelength of 1064 nm, this quantum defect is about 4%. Which is less than half compared to pumping at 976 nm (which may be associated with a 8.4% quantum defect). Secondly, the signal injected into the power amplifier may be significantly greater than 0.1 kW. Both factors may provide a higher threshold condition for Modal Instability. This may provide greater than 10 kW of spectral beam combining (SBC) and coherent beam combining (CBC) combinable power. The tandem pumped fiber amplifier may use regular LMA fiber technology without compromising the total efficiency of the system. All of this can be achieved by pumping with low SWAP (size, weight and power) and low-cost multimode diode pumps rather than using a multitude of expensive and bulky single mode fiber lasers.

As used in this application and in the claims, the singular forms "a." "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best". "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper." "lower," and the like. These terms are used for convenient description, but do not imply any particular spatial orientation.

FIG. 1 illustrates a tandem pumped fiber amplifier 100. The tandem pumped fiber amplifier 100 may include a seed laser 105 with a selected center wavelength that may be pseudo random bit sequence (PRBS) phase-modulated to achieve necessary bandwidth to suppress SBS and keep coherence length long enough for SBC and CBC applications. The selected center wavelength may be in the range of 1020-1080 nm for Yb-doped fiber, in some embodiments. The seed laser 105 may include a preamplifier (not shown) to generate sufficient power, e.g., greater than 20 W of seed power for amplification in the subsequent sections.

Fiber of the seed laser 105 may be coupled to (e.g., spliced) with fiber of a tandem oscillator pump and booster amplifier (TOP-booster amplifier) 110, which may be coupled to (e.g., spliced) with fiber of a power amplifier 115. The TOP-booster amplifier 110 may include a first section of a single or plural active core fiber (e.g., a dual active core fiber), and at least one set of one or more diode pumps optically coupled, e.g., end-coupled, side-coupled, or the like, or combinations thereof, to the diode pump set.

Figure 2:
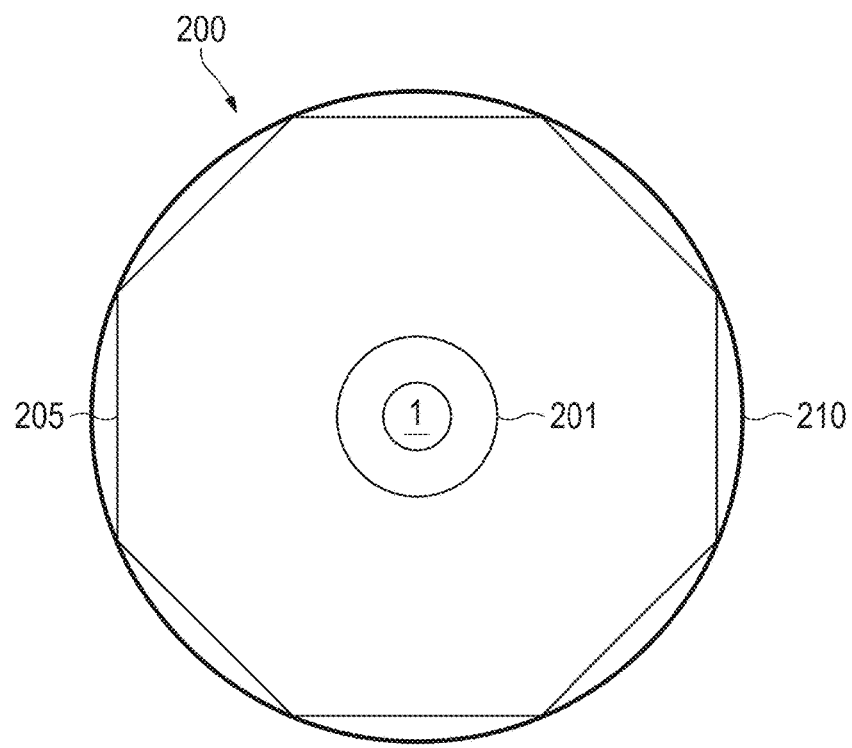
FIG. 2 illustrates a cross-section view of a coaxial dual active core fiber that may be utilized in a tandem pumped fiber amplifier, in some embodiments.

In a plural active core example, some the cores of the plural active core fiber (e.g., both of the cores of a dual active core fiber laser) may be arranged along a same axis or a different axis (e.g., coaxial with the second core symmetrically surrounding the first core or with the second core asymmetrically surrounding the first core). FIG. 2 illustrates a cross-section view of a coaxial-type dual active core fiber 200 that may be utilized in the tandem pumped fiber amplifier 100 of FIG. 1, in some embodiments. FIG. 5 illustrates a cross-section view of a single active core fiber 500 that may be utilized in the tandem pumped fiber amplifier 100 of FIG. 1, in some embodiments.

Referring now to FIG. 2, the coaxial-type dual active core fiber 200 includes a first core 1 surrounded by a second core 201. In some embodiments, the first core 1 may have a first diameter, and the second core 201 may have a second different diameter (e.g., a second larger diameter). In one embodiment, the first diameter may be ~12.5 μm and the second diameter may be ~35 μm.

The first core 1 may be doped differently than the second core 201. In one embodiment, the first core 1 may include a first doping concentration and the second core 201 may include a second doping concentration associated with a higher absorption coefficient. In some embodiments, the first core 1 may include Yb-700 (Yb~$50 \times 10^{24}$ m$^{-3}$) and the second core 201 may include with Yb-1200 (Yb~$120 \times 10^{24}$ m$^{-3}$).

In some examples, the first core 1 may have a numerical aperture (NA) that is not greater than an NA of the second core 201. In one embodiment, the first core 1 may have an NA of about 0.05 or less and the second core 201 may have an NA no less than 0.05, e.g., in the range of 0.05-0.10.

The fiber 200 may include a cladding 205 surrounding the cores 1 and 201, and a jacket 210. The cladding 205 may be a glass-clad multimode pump guiding octagonal core with a third diameter that is greater than the second diameter of the second core, e.g., ~800 μm.

Referring now to FIG. 5, the single active core fiber 500 may include a first section (110, FIG. 1) and a second section (115, FIG. 1). The first section 110 may include a core 501 having a diameter of ~10-12 μm. The core 501 of this section 110 may be doped with Yb-700 (Yb~$50 \times 10^{24}$ m$^{-3}$). The core 501 of this section 110 may have an NA of about 0.05 (in one embodiment, 0.07).

The fiber 500 in the first section 110 may include a cladding 505 surrounding the core 501, and a jacket 510. The cladding 505 and the jacket 510 may be similar to any cladding or jacket described herein. The cladding 505 may be a glass-clad multimode pump guiding octagonal core with a diameter that is greater than the diameter of the core 501, e.g., ~800 μm.

The second section 115 may include a core 501 having a diameter of ~17-35 µm. The core 501 of this section 115 may be doped with Yb-700 (Yb~50×10$^{24}$ m$^{-3}$) and/or with a doping profile of 80-85% confined doping. The core 501 of this section 115 may have an NA of about 0.05 (in one embodiment, 0.07). The fiber 500 in the second section 115 may have a similar cladding 505 and jacket 510 as in the first section 110.

Referring again to FIG. 1, the TOP booster-amplifier 110 may include the first section of the single or plural active core fiber. The first section may include a first fiber Bragg grating (FBG) and a second FBG (e.g., an HR (highly reflective) FBG and a PR (partially reflecting) FBG, respectively), which may include diameters corresponding to core structure, e.g., the second core 201 (FIG. 2) or the core 501 (FIG. 5). The first and second FBGs may be centered at a selected wavelength to form a multi-mode oscillator which builds up necessary power for the tandem pump to be used by the power amplifier 115.

The selected wavelength may be less than a center wavelength of the seed laser. A difference may be 3% or less (e.g., 2.3%) in some examples and/or in a range of 0.1-6%. In this range, with a core structure having sufficient dimensions to suppress Modal Instability, and SBS. The selected wavelength may be in the range of 1010-1045 nm (e.g., 1018 nm), in one embodiment.

In some examples, the doping of the first core 1 (FIG. 2) or the core 501 (FIG. 5) may be selected to generate only sufficient single mode seed power w % bile it is bi-chromatically pumped by both the multimode 976 nm pump as well as the 1018 nm tandem pump (which may be generated within the core structure). The oscillator of the first section of the single or plural active core fiber may use the doped core structure to convert most of the 976 nm multi-mode pump power into 1018 nm wavelength within the core structure. Residual unabsorbed 976 nm pump (e.g., several percent) may enter the cladding of the second section of the single or plural active core fiber (e.g., the power amplifier 115) and be utilized, which may optimize overall efficiency (e.g., overall electrical-to-optical power conversion efficiency). An o-o efficiency corresponding to the first section may be 3% more efficient due to lower quantum defect when generating 1018 nm wavelength compared to 1064 nm amplifiers.

FIGS. 3A-C (dual active core embodiment) illustrate, respectively, a graph 300 (FIG. 3A) of calculated signal power and tandem pump power inside a final power amplifier along with upper state population for a tandem pumped fiber amplifier 350 (FIG. 3B), a block diagram of the tandem pumped fiber amplifier 350, and a cross-section view of a dual-core and all-glass-fiber 375 (FIG. 3C) of the tandem pumped fiber amplifier 350. FIGS. 6A-C (single active core embodiment) illustrate, respectively, a graph 600 (FIG. 6A) of calculated signal power and tandem pump power inside a final power amplifier along with upper state population for a tandem pumped fiber amplifier 650 (FIG. 6B), a block diagram of the tandem pumped fiber amplifier 650, and a cross-section view of a single active core and all-glass-fiber 675 (FIG. 6C) of the tandem pumped fiber amplifier 650.

Modeling of the tandem pumped fiber amplifier 350 (FIG. 3B) has shown an absorption of greater than 0.51 dB (of 976 nm and 1018 nm) and greater than 15 dB (of 976 nm) in the second core. When the longest signal wavelength of 1080 nm at 20 W is launched into a first section of the fiber 375, greater than 1.27 kW of signal may be generated which can be amplified in the second section of the fiber 375. Modeling of the plural active core embodiment of FIGS. 3A-C predicts greater than 83% conversion efficiency for the 976 nm multimode pump into a 1018 nm tandem pump, and power levels of greater than 12.5 kW may be generated in the second core of the fiber 375 given a 10-meter-long oscillator. Results of this simulation are shown in the graph 300.

Modeling of the tandem pumped fiber amplifier 650 (FIG. 6B) has shown similar results. In a ~8 meter "effective" fiber length, a core with Yb-700 may achieve absorption of greater than 0.51 dB (of 976 nm and 1018 nm) and greater than 15 dB (of 976 nm) in the core. However, when the longest signal wavelength of 1080 nm at 20 W is launched into a first section of the fiber 375, greater than 10 kW of signal may be generated which can be amplified in the second section of the fiber 675. Modeling of the single active core embodiment of FIGS. 6A-C predicts greater than 83% conversion efficiency for the 976 nm multimode pump into a 1018 nm tandem pump, and power levels of greater than 12.5 kW may be generated in the core of the fiber 675 given a 10-meter-long oscillator and Yb-1200 doping. Results of this simulation are shown in the graph 600.

Referring now to FIGS. 3A-C, FIG. 3C shows a refractive index of the first core, the second core, the inner glass clad, as well as relative doping concentration in the cores. In this embodiment, the values 376-379 may be, respectively, 880 µm, 800p, 35 µm, and 12.5 µm, and the core region 381 may include a first doping profile of Yb-700~50×10$^{24}$ m$^{-3}$ and the core region 382 may include a second different profile of Yb-1200~120×10$^{24}$ m$^{-3}$. In other embodiments, the values 376-379 may be, respectively, 880 µm, 800 µm, 35 µm, and 14 µm. FIG. 6C shows a refractive index of the core, the inner glass clad, as well as doping concentration in the core. In this embodiment, the values 676, 677, and 679 may be, respectively, 660-880 µm, 600-800 µm, and 10-12 µm (oscillator fiber)/17-35 µm (power amplifier fiber), and the core region 681 may include a doping profile of Yb-700~50×10$^{24}$ m$^{-3}$ (oscillator fiber and/or power amplifier fiber) or 80-85% confined doping in the core of the power amplifier fiber.

The seed laser of any tandem pumped fiber amplifier described herein may be, for SBC or CBC, a single-mode semiconductor laser such as a distributed feedback (DFB) laser or a non-planar ring oscillator (NPRO) and phase modulated to suppress SBS (for other applications any appropriate single mode seed, e.g., any 20 W single mode seed, may be used). The seed laser may be 1064 nm.

A TOP boost amplifier of the tandem pumped fiber amplifier 350 (FIG. 3B) may include a dual active core and a plural clad, e.g., dual or triple clad. The inner core may be doped to generate sufficient power at seed wavelength need to enter the power amplifier stage. The outer multimode core may be doped to convert a portion (e.g., most) of the 976 nm diode pump into the 1018 nm tandem pump. The tandem oscillator pump may use HR and PR FBG's to generate a ~10 nm bandwidth multi-mode oscillator using a combination of the inner and outer cores, which may be doped at the same level or differently. HR and PR FBG's may have the same core diameter as the outer multimode core of the TOP-booster gain amplifier. The seed wavelength that is injected into this stage may be amplified by both the 976 nm multimode pump as well as the 1018 nm tandem pump that is generated inside the oscillator cavity, e.g., with different absorption coefficient determined by the rare earth dopant absorption cross section at these wavelengths and the core-to-clad area ratios. The power scaling of this laser may be done by adding more diode pumps as needed to reach target power values, e.g., 3 kW, 5 kW, 10 kW, etc. In some embodiments, the "effective multimode HR-FBG" may be one of the following types:

1. FBG written in Ge-doped fiber with a core diameter equal to 379 (FIG. 3C) or 479 (FIG. 4).
2. FBG written in Ge-doped fiber with a core diameter equal to 379 (FIG. 3C) or 479 (FIG. 4) and spliced to a passive chirally-coupled core fiber of the same core size so as to strip off the higher order modes so that reflectivity of the FBG is greater than 99%.
3. FBG written in grated-index (GRIN) fiber with an "effective core diameter" equal to 379 (FIG. 3C) or 479 (FIG. 4).
4. FBG written in GRIN fiber with an "effective core diameter" equal to 379 (FIG. 3C) or 479 (FIG. 4) and spliced to a passive chirally-coupled fiber of the same core size so as to strip off the higher order modes so that reflectivity of the FBG is greater than 99%.
5. FBG written in a multimode fiber with rings of alternating high-index and low index shells.
6. The seed wavelength that is injected into this stage may be amplified by both the 976 nm multimode pump as well as the 1018 nm tandem pump that is generated inside the oscillator cavity, e.g., with different absorption coefficient determined by the rare earth dopant absorption cross section at these wavelengths and the core-to-clad area ratios. The power scaling of this laser may be done by adding more diode pumps as needed to reach target power values, e.g., 3 kW, 5 kW, 10 kW, etc.

The final power amplifier of the tandem pumped fiber amplifier 350 may use all of the 1018 nm tandem pump in the inner cladding and a portion (e.g., all) any residual 976 nm light not absorbed in the oscillator but guided in the outer clad to amplify seed wavelength and mode-field-adaptor may be used to match the single mode beam in the TOP-booster fiber and the final power amplifier. Some embodiments may use a cladding light stripper (CLS) to strip off the residual 976 nm pump before the output endcap.

Some embodiments include a plural active core fiber in a ~6 meter "effective" fiber length including a Yb-doped core region, an undoped inner clad region, and an outer clad region (e.g., an outer glass-clad). In one embodiment, the dimensions of the doped core region, the undoped inner clad region, and the outer clad region may be 20-25 µm, 70 µm, and 400-60 µm, respectively (pump guide may be 800 µm). The plural active core fiber may include a final power amplifier including a mode-field adaptor to match the mode to a power amplifier section of the plural active core fiber. A 1018 nm tandem pump may be guided in the inner clad region and may pump the signal in the innermost core of the plural active core fiber.

FIG. 4 illustrates a refractive index 400 of a fiber that is similar to the fiber 375 of FIG. 3C and includes a dual active core triple fiber clad. In this example, the values 476-479 are, respectively, 660-880 µm, 600-800 µm/0.022 NA or higher, ~35 µm (Yb-1200 doped annulus/0.05 NA), ~10 µm (Yb-700 doped/0.065 NA).

Referring now to FIGS. 6A-C, a tandem oscillator pump and booster amplifier (TOP-booster amplifier) may include a core (10 µm and 25 µm) and a plural clad (e.g., DCF or TCF). For a seed wavelength of 1030-1080 nm, the pump wavelength may be 1018-1030 nm. The TOP-booster amplifier may be coupled to (e.g., spliced) with fiber of a power amplifier. The power amplifier may include a core (20-35 µm) and a plural clad (e.g., DCF or TCF). An outer clad may be 400-600 µm. In some embodiments, the power amplifier comprises an end-core & side-clad-pumped tandem power amplifier with a wavelength of 1030 to 1080 nm. The power scaling of this laser may be done by adding more diode pumps as needed to reach target power values, e.g., greater than 10 kW.

The final power amplifier of the tandem pumped fiber amplifier 650 may use all of the 1018 nm tandem pump in the inner cladding and a portion (e.g., all) any residual 976 nm light not absorbed in the oscillator but guided in the outer clad to amplify seed wavelength and mode-field-adaptor may be used to match the single mode beam in the TOP-booster fiber and the final power amplifier. Some embodiments may use a cladding light stripper (CLS) to strip off the residual 976 nm pump before the output endcap.

Mitigating Spectral Broadening Due to Four-Wave Mixing

While the power-scaling without the onset of transverse modal instability (TMI) using tandem pumped fiber amplifier embodiments similar to the embodiments described with reference FIG. 6A-C was successful to 4.3 kW (pump limited and no onset of TMI observed, some embodiments may exhibit a broadening of the spectral width as a function of output power. This broadening may not impact applications that are not sensitive to spectral width. However, some applications, such as spectral beam combining and coherent beam combining, may require good coherence length (e.g., not less than 5 mm of fiber length) and/or maintaining narrow linewidth (e.g., not greater than 15 GHz).

In various embodiments, the spectral linewidth broadening may be related to four-wave mixing of the seed wavelength and the tandem oscillator wavelength(s). This spectral broadening may be mitigated using one or more of the features described herein.

Referring again to FIG. 6B, a very short gain fiber (e.g., not greater than 0.5 meters long) may be used for the oscillator section of the tandem pumped fiber amplifier 650. Known oscillator gain fiber sections may typically be greater than five meters long. Use of this very short gain fiber for the oscillator section of the tandem pumped fiber amplifier 650 may mitigate spectral broadening related to four-wave mixing.

Polarization may be used to mitigate spectral broadening related to four-wave mixing. FIG. 7 illustrates a block diagram of a tandem pumped fiber amplifier 750 with polarization control, according to various embodiments. In one embodiment, the oscillator 700 is a polarized oscillator, which may be any polarized oscillator now known or later developed. In some embodiments, a polarized oscillator may include stress rods for polarization control and/or may use a chirally coupled core (3 C) that may produce polarized laser light without stress rods. In such an embodiment, the other components may be similar in any respect the corresponding components of the tandem pumped fiber amplifier 650 (FIG. 6B).

In another embodiment, a tandem pumped fiber amplifier 750 with polarization control may include a polarized seed 710, which may be any polarized seed now known or later developed. In such an embodiment, the oscillator 700 and the power amplifier 710 may be, respectively, any unpolarized oscillator now known or later developed or any unpolarized power amplifier now known or later developed.

In another embodiment, the tandem pumped fiber amplifier 750 may use a polarized seed 710 or a polarized oscillator 700, and a polarized or unpolarized amplifier 711. If the power amplifier 711 is polarized, then its polarization may be aligned with the seed laser 710, e.g., orthogonally polarized to the oscillator 700.

A very low power pump at the oscillator stage may be used to mitigate spectral broadening related to four-wave mixing. FIG. 8 illustrates a block diagram of a tandem pumped fiber amplifier 850 using a low power pump 800, according to various embodiments. Low power pump 800 may be not greater than 100 W (e.g., one or more individual pumps have a combined power of not greater than 100 W). This may reduce heating of the fiber Bragg gratings (either the PR-FBG or any fiber DFB (distributed feedback) described herein), thus mitigating the broadening of the spectral width. Some embodiments may use a high power (e.g., 1 kW of pump power or greater) in the power amplifier section, as illustrated. The other components may be similar in any respect to the corresponding components of any tandem pumped fiber amplifier described herein (including but not limited to tandem pumped fiber amplifier 650 of FIG. 6B).

FIG. 9 illustrates a block diagram of a tandem pumped fiber amplifier 950 using a fiber DFB oscillator 900, according to various embodiments. The fiber DFB oscillator 900 may include a narrow linewidth (e.g., a less than 0.05 nm PR-FBG), which may produce a single longitudinal mode output with narrow linewidth single mode to mitigate spectral broadening related to four-wave mixing.

FIG. 10 illustrates a block diagram of a tandem pumped fiber amplifier 1050, according to various embodiments. A first section of the tandem pumped fiber amplifier 1050 operates as the oscillator and may include a single DFB diode oscillator or a semiconductor MOPA (master oscillator power amplifier), and the second section may be similar in any respect to any power amplifier described herein. These single mode semiconductor laser sources may be wavelength-division multiplexed with the seed (e.g., 1064 nm) and injected simultaneously into the amplifier core. A semiconductor MOPA may include a DFB or DBR (distributed Bragg reflector) as the oscillator in the MOPA (e.g., 1040 nm).

FIG. 11 illustrates a block diagram of a counter-pumped fiber amplifier 1150, according to various embodiments. Here, a clad light stripper (CLS) 1100 and a mode field adaptor (MFD) may be arranged as shown to strip unabsorbed diode pump light to mitigate spectral broadening due to four-wave mixing.

FIG. 12 illustrates a block diagram of another counter-pumped fiber amplifier 1250, according to various embodiments. An HR-FBG (e.g., 1040 nm) 1200 may be employed after the power amplifier and before the endcap to reflect back 1040 nm light in the core to be reabsorbed in a second pass to improve efficiency and suppress 1040 nm light from forward propagation and producing a mixed wavelength emission.

In various embodiments, a tandem pumped fiber amplifier may be similar to any tandem pumped fiber amplifier described herein (e.g., tandem pumped fiber amplifier 650 of FIG. 6B) in various respects but may include one or more of the components/techniques described above (e.g., polarization control, very short fiber, very low power, etc.) to mitigate spectral broadening related to four-wave mixing. This tandem pumped fiber amplifier may achieve greater than 4 kw single narrowband fiber amplifiers, which may be employed in directed energy or other applications. Also, this tandem pumped fiber amplifier may be used in additive manufacturing in the 2-4 kW range.

Examples of Mitigating Spectral Broadening in a Tandem Pumped Fiber Amplifier Due to Four-Wave Mixing Example 1 is an apparatus including a seed laser, a first section coupled to an output of the seed laser, and a second section coupled to an output of the first section, the apparatus comprising: an optical fiber including at least one core, wherein the seed laser is optically coupled to the at least one core; the first section to operate as an oscillator and the second section to operate as a power amplifier, wherein at least the second section includes the optical fiber to operate as the power amplifier; and one or more diode pumps optically coupled to the first section, wherein the first section is arranged to convert the one or more diode pumps into a tandem pump, wherein the one or more diode pumps and the tandem pump bi-chromatically pump the power amplifier; and wherein a selected wavelength associated with the oscillator is less than a center wavelength of the seed laser, and wherein the at least one core suppresses modal instability when a difference between the selected wavelength and the center wavelength is in a range of 0.1-8%; wherein the apparatus comprises a counter-pumped fiber amplifier, or wherein the first section is a length of the optical fiber that is not greater than 0.5 meters long, the oscillator comprises a polarized oscillator, the seed laser comprises a polarized seed laser, a total power output of the one or more power pumps is not greater than 100 W, the oscillator include a narrow linewidth, or the first section comprises a semiconductor oscillator.

Example 2 includes the subject matter of example 1 and/or any other example herein, wherein the polarized oscillator includes stress rods for polarization control or includes a chirally coupled core (3 C) to produce polarized light without stress rods.

Example 3 includes the subject matter of any of examples 1-2 and/or any other example herein, wherein the seed laser comprises the polarized seed laser and the oscillator comprises a polarized oscillator.

Example 4 includes the subject matter of any of examples 1-3 and/or any other example herein, wherein the power amplifier comprises an unpolarized amplifier.

Example 5 includes the subject matter of any of examples 1-4 and/or any other example herein, wherein the power amplifier comprises a polarized amplifier and its polarization is orthogonally polarized to the oscillator.

Example 6 includes the subject matter of any of examples 1-5 and/or any other example herein, wherein the apparatus comprises a greater than 1 kW pump coupled to the power amplifier.

Example 7 includes the subject matter of any of examples 1-6 and/or any other example herein, wherein oscillator includes a less than 0.05 nm PR-FBG (partially-reflective fiber Bragg grating) to produce a single longitudinal mode output with a narrow linewidth to mitigate spectral broadening related to four-wave mixing.

Example 8 includes the subject matter of any of examples 1-7 and/or any other example herein, wherein the semiconductor oscillator comprises a semiconductor single mode DFB (distributed feedback) diode oscillator or a semiconductor MOPA (master oscillator power amplifier).

Example 9 includes the subject matter of any of examples 1-8 and/or any other example herein, wherein the semiconductor MOPA includes a DFB or DBR (distributed Bragg reflector).

Example 10 includes the subject matter of any of examples 1-9 and/or any other example herein, wherein the counter-pumped fiber amplifier comprises a CLS (cladding light stripper) to strip unabsorbed diode pump light to mitigate spectral broadening due to four-wave mixing, or an HR-FBG (highly-reflective FBG) at the oscillator emission wavelength that is employed after the power amplifier to reflect back light in the core and of a first pass to be reabsorbed in a second pass.

Example 11 includes the subject matter of any of examples 1-10 and/or any other example herein, wherein a center wavelength of the seed laser is in a range of 1020-1080 nm.

Example 12 includes the subject matter of any of example 1-11 and/or any other example herein, wherein the selected wavelength is in the range of 1010-1045 nm.

Example 13 includes the subject matter of any of examples 1-12 and/or any other example herein, wherein the oscillator comprises a multimode oscillator.

Example 14 includes the subject matter of any of examples 1-13 and/or any other example herein, wherein the first section includes a highly reflective fiber Bragg grating (HR-FBG) associated with the oscillator and partially reflecting fiber Bragg grating (PR-FBG) associated with the oscillator.

Example 15 includes the subject matter of any of examples 1-14 and/or any other example herein, wherein the seed laser is optically coupled to a single active core of the optical fiber.

Example 16 is a method of mitigating spectral broadening in any tandem pumped fiber amplifier described herein.

In view of the many possible embodiments to which the principles of the disclosed technology may be applied, it should be recognized that the illustrated embodiments are only preferred examples and should not be taken as limiting the scope of the disclosure. We claim as our invention all that comes within the scope and spirit of the appended claims.

The invention claimed is:

1. An apparatus for high energy laser (HEL) applications and including a first section coupled to an output of a seed laser, and a second section coupled to an output of the first section, the apparatus comprising:
    an optical fiber including at least one core, wherein the seed laser is optically coupled to the at least one core;
    the first section to operate as an oscillator and the second section to operate as a power amplifier, wherein the second section includes the optical fiber including a polarized or unpolarized amplifier;
    one or more diode pumps optically coupled to the first section; and
    a counter-pumped fiber amplifier, or wherein the first section is a length of the optical fiber that is not greater than 0.5 meters long, the oscillator comprises a polarized oscillator, the seed laser comprises a polarized seed laser, a total power output of the one or more diode pumps is not greater than 100 W, the oscillator includes a narrow linewidth, or the first section comprises a semiconductor oscillator,
    wherein the first section is arranged to convert the one or more diode pumps into a tandem pump, wherein the one or more diode pumps and the tandem pump bi-chromatically pump the power amplifier;
    wherein a selected wavelength associated with the oscillator is less than a center wavelength of the seed laser, wherein the at least one core is dimensioned to suppress modal instability at 2 kW or greater output power when a difference between the selected wavelength and the center wavelength is in a range of 0.1-8%.

2. The apparatus of claim 1, wherein a single active core is employed.

3. The apparatus of claim 1, wherein a core-to-cladding area ratio is uniform through the entire length of the second section.

4. The apparatus of claim 1, wherein the polarized oscillator includes stress rods for polarization control or includes a chirally coupled core (3 C) to produce polarized light without stress rods.

5. The apparatus of claim 1, wherein the seed laser comprises the polarized seed laser and the oscillator comprises a polarized oscillator.

6. The apparatus of claim 5, wherein the power amplifier comprises an unpolarized amplifier.

7. The apparatus of claim 5, wherein the power amplifier comprises a polarized amplifier and its polarization is orthogonally polarized to the oscillator.

8. The apparatus of claim 1, wherein the apparatus comprises a greater than 1 kW pump coupled to the power amplifier.

9. The apparatus of claim 1, wherein oscillator includes a less than 0.05 nm PR-FBG (partially-reflective fiber Bragg grating) to produce a single longitudinal mode output with a narrow linewidth to mitigate spectral broadening related to four-wave mixing.

10. The apparatus of claim 1, wherein the semiconductor oscillator comprises a semiconductor single mode DFB (distributed feedback) diode oscillator or a semiconductor MOPA (master oscillator power amplifier).

11. The apparatus of claim 10, wherein the semiconductor MOPA includes a DFB or DBR (distributed Bragg reflector).

12. The apparatus of claim 1, wherein the counter-pumped fiber amplifier comprises a CLS (cladding light stripper) to strip unabsorbed diode pump light to mitigate spectral broadening due to four-wave mixing, or an HR-FBG (highly-reflective FBG) at the oscillator emission wavelength that is employed after the power amplifier to reflect back light in the core and of a first pass to be reabsorbed in a second pass.

13. The apparatus of claim 1, wherein a center wavelength of the seed laser is in a range of 1020-1080 nm.

14. The apparatus of claim 1, wherein the selected wavelength is in the range of 1010-1045 nm.

15. The apparatus of claim 1, wherein the oscillator comprises a multimode oscillator.

16. The apparatus of claim 1, wherein the first section includes a highly reflective fiber Bragg grating (HR-FBG) associated with the oscillator and partially reflecting fiber Bragg grating (PR-FBG) associated with the oscillator.

17. The apparatus of claim 1, wherein the seed laser is optically coupled to a single active core of the optical fiber.

18. A method comprising:
    providing a tandem pumped fiber amplifier including a first section coupled to an output of a seed laser, and a second section coupled to an output of the first section, tandem pumped fiber amplifier including:
    an optical fiber including at least one core, wherein the seed laser is optically coupled to the at least one core;
    the first section to operate as an oscillator and the second section to operate as a power amplifier, wherein the second section includes the optical fiber including a polarized or unpolarized amplifier; and
    one or more diode pumps optically coupled to the first section,
    wherein the first section is arranged to convert the one or more diode pumps into a tandem pump, wherein the one or more diode pumps and the tandem pump bi-chromatically pump the power amplifier;

wherein a selected wavelength associated with the oscillator is less than a center wavelength of the seed laser, wherein the at least one core is dimensioned to suppress modal instability at 2 kW or greater output power when a difference between the selected wavelength and the center wavelength is in a range of 0.1-8%; and mitigating spectral broadening of the tandem pumped fiber amplifier due to four-wave mixing.

19. The method of claim 18, wherein the tandem pumped fiber amplifier the comprises a counter-pumped fiber amplifier, or wherein the first section is a length of the optical fiber that is not greater than 0.5 meters long, the oscillator comprises a polarized oscillator, the seed laser comprises a polarized seed laser, a total power output of the one or more power pumps is not greater than 100 W, the oscillator include a narrow linewidth, or the first section comprises a semiconductor oscillator.

* * * * *